(12) United States Patent
Rivoir

(10) Patent No.: US 7,847,716 B2
(45) Date of Patent: Dec. 7, 2010

(54) ASYNCHRONOUS SIGMA-DELTA DIGITAL-ANALOG CONVERTER

(75) Inventor: Jochen Rivoir, Magstadt (DE)

(73) Assignee: Verigy (Singapore) Pte. Ltd., Singapore (SG)

(*) Notice: Subject to any disclaimer, the term of this patent is extended or adjusted under 35 U.S.C. 154(b) by 0 days.

(21) Appl. No.: 12/376,121

(22) PCT Filed: Aug. 1, 2006

(86) PCT No.: PCT/EP2006/064886

§ 371 (c)(1),
(2), (4) Date: Nov. 4, 2009

(87) PCT Pub. No.: WO2008/014816

PCT Pub. Date: Feb. 7, 2008

(65) Prior Publication Data

US 2010/0045499 A1      Feb. 25, 2010

(51) Int. Cl.
*H03M 3/00* (2006.01)

(52) U.S. Cl. .................................. 341/143; 375/295

(58) Field of Classification Search ......... 341/143–144; 375/295, 296; 332/106

See application file for complete search history.

(56) References Cited

U.S. PATENT DOCUMENTS

| | | | |
|---|---|---|---|
| 6,087,968 A * | 7/2000 | Roza | 341/143 |
| 6,628,218 B2 * | 9/2003 | Brooks et al. | 341/143 |
| 6,771,199 B2 * | 8/2004 | Brooks et al. | 341/143 |
| 7,479,907 B2 * | 1/2009 | Lazar | 341/110 |
| 7,592,939 B1 * | 9/2009 | Cruz-Albrecht et al. | 341/144 |
| 7,733,171 B2 * | 6/2010 | Guilherme et al. | 330/10 |
| 7,746,256 B2 * | 6/2010 | Wiesbauer et al. | 341/143 |

* cited by examiner

*Primary Examiner*—Lam T Mai
(74) *Attorney, Agent, or Firm*—Holland & Hart, LLP

(57) ABSTRACT

An asynchronous sigma delta digital to analog converter for converting a digital input signal into an analog output signal, the digital to analog converter having an asynchronous sigma delta modulator having a low pass filter and a comparator and being supplied with the digital input signal, and a clock sample unit adapted to sample a signal processed by the comparator based on a clock signal, thereby generating the analog output signal.

17 Claims, 1 Drawing Sheet

ASYNCHRONOUS SIGMA-DELTA DIGITAL-ANALOG CONVERTER

BACKGROUND OF THE INVENTION

The present invention relates to data processing.

In electronics, a digital-to-analog converter (DAC) may be denoted as a device for converting a digital (usually binary) code to an analog signal. Digital-to-analog converters are the interface between the abstract digital world and the analog real life. Simple switches, a network of resistors, current sources or capacitors may implement this conversion. An analog-to-digital converter (ADC) performs the reverse operation.

Engel Roza "Analog-to-Digital Conversion via Duty-Cycle Modulation", IEEE Transactions an Circuits and Systems—II: Analog and Digital Signal Processing, Vol. 44, No. 11, 1997, pp. 907 to 914 discloses an asynchronous sigma-delta modulator ADC.

U.S. Pat. No. 6,087,968 discloses an analog to digital converter comprising an asynchronous sigma-delta modulator generating an asynchronous duty cycle modulated square wave, sampling means to synchronously sample the asynchronous square wave and a decimating digital filter to convert the samples from the sampling means into a desired PCM-format (Pulse Code Modulation).

U.S. Pat. No. 5,396,244 discloses a digital-to-analog converter comprising a sigma-delta modulator for generating a 1-bit digital signal modulated synchronously with a clock signal in response to a digital input signal. This modulator is followed by an asynchronous analog sigma-delta modulator for generating a bivalent asynchronously modulated signal in response to the synchronously modulated digital signal. The information in the digital signal from the sigma-delta modulator resides in signal transitions which can appear exclusively at discrete instants defined by the clock signal. The information in the asynchronously modulated signal from the asynchronous sigma-delta modulator is contained in an analog variation of the duty cycle. This means that the signal transitions of the asynchronously modulated signal are not tied to a fixed pattern of discrete instants but that all the intervening instants are also available.

SUMMARY

According to an embodiment, an asynchronous sigma delta digital to analog converter for converting a digital input signal into an analog output signal may have an asynchronous sigma delta modulator having a loop filter and a comparator with a hysteresis function, the asynchronous sigma delta modulator being supplied with the digital input signal; a clock sample unit adapted to sample, based on a clock signal, a signal outputted by the comparator, thereby generating the analog output signal.

According to another embodiment, a measurement apparatus may have a data generation unit adapted to generate a digital input signal related to a measurement carried out by the measurement apparatus; an asynchronous sigma delta digital to analog converter for converting the digital input signal into an analog output signal, having an asynchronous sigma delta modulator having a loop filter and a comparator with a hysteresis function, the asynchronous sigma delta modulator being supplied with the digital input signal; a clock sample unit adapted to sample, based on a clock signal, a signal outputted by the comparator, thereby generating the analog output signal.

According to another embodiment, a method of converting a digital input signal into an analog output signal may have the steps of supplying the digital input signal to an asynchronous sigma delta modulator having a loop filter and a comparator with a hysteresis function; sampling, based on a clock signal, a signal outputted by the comparator, thereby generating the analog output signal.

According to another embodiment, a computer-readable medium may have stored thereon a computer program of converting a digital input signal into an analog output signal, which computer program, when being executed by a processor, is adapted to control or carry out a method of converting a digital input signal into an analog output signal, the method having the steps of supplying the digital input signal to an asynchronous sigma delta modulator having a loop filter and a comparator with a hysteresis function; sampling, based on a clock signal, a signal outputted by the comparator, thereby generating the analog output signal.

Another embodiment may have a program element of converting a digital input signal into an analog output signal, which program element, when being executed by a processor, is adapted to control or carry out a method of converting a digital input signal into an analog output signal, the method having the steps of supplying the digital input signal to an asynchronous sigma delta modulator having a loop filter and a comparator with a hysteresis function; sampling, based on a clock signal, a signal outputted by the comparator, thereby generating the analog output signal.

Embodiments of the invention can be partly or entirely embodied or supported by one or more suitable software programs, which can be stored on or otherwise provided by any kind of data carrier, and which might be executed in or by any suitable data processing unit. Software programs or routines can be applied for digital to analog conversion. The digital to analog conversion scheme according to an embodiment of the invention can be performed by a computer program, i.e. by software, or by using one or more special electronic optimization circuits, i.e. in hardware, or in hybrid form, i.e. by means of software components and hardware components.

In the context of this application, the term "loop filter" may particularly denote a frequency selective digital filter. Examples for a loop filter are a low-pass filter, an integrator, or a band-pass filter, and may be of arbitrary order and/or frequency response. The loop filter may have a high gain in a relatively small frequency band where the signal output is expected to be of high quality. As a consequence the closed loop dynamics may reduce the quantization noise introduced by the comparator in this frequency band of interest. Outside this frequency band, the loop filter gain is typically small to make the closed loop stable. The outer quantization noise will typically be attenuated by an analog filter (see reference numeral 112). More details can be found in "Understanding Delta-Sigma Data Converters" by Richard Schreier and Gabor C. Temes, IEEE Press, 2005.

In the context of this application, the term "comparator with hysteresis function" may particularly denote a non-linear function where the output equals a first output level when the input level is smaller than a first lower threshold level, it outputs a second output level when the input level is larger than a second upper threshold level, and remains essentially unchanged when the input level is between the first lower threshold level and the second upper threshold level. The second upper threshold is larger than the first lower threshold level. When both threshold levels are equal, the comparator has no hysteresis. The difference between the second upper threshold level and the first lower threshold level is also denoted as hysteresis slack.

According to an exemplary embodiment, an asynchronous sigma-delta DAC is provided in which signal sampling by a clock signal may be performed after having processed a digital input signal to be converted into an analog output signal by an asynchronous sigma delta modulator. This may provide an alternative DAC architecture and may allow to significantly simplify the construction and the operation of the DAC. It may be dispensable to use the clock signal already during signal processing by the asynchronous sigma delta modulator having a digital loop and a hysteresis comparator.

Such a digital analog converter may be constructed basically on the basis of digital components, so that a number of analog components may be reduced or minimized. This may allow for a high accuracy and may reduce efforts and costs for constructing the device.

According to an exemplary embodiment, a digital-to-analog converter is provided in which an asynchronous sigma-delta modulator is used as an input stage in a signal processing path, and a signal resulting from the processing scheme in the sigma-delta modulator can be sampled subsequently based on a clock signal. A delta-sigma modulator may be particularly denoted asynchronous when its output (fed back signal) is not clocked and can therefore transition at arbitrary points in time that are not dictated by a fix clock raster.

This paragraph contrasts the operation of an asynchronous sigma-delta modulator to the operation of a synchronous sigma-delta modulator. The comparator output of a synchronous sigma-delta modulator is clocked and used as a feedback. As a consequence, it is possible to take up to one sample clock period until the feedback signal propagates the information about the changing sign of the comparator input. This time quantization may lead to varying feedback latencies and finally to undesired noise at the output. Increasing the sample clock rate reduces this time quantization noise but also makes the comparator output earlier available to the loop filter, increasing the rate at which the control loop jumps back and forth. The increased transition rate of the modulator output increases the sensitivity to sample clock jitter and therefore increases another noise source. Removing the sampling unit altogether would theoretically lead to infinitely fast oscillations. To limit the oscillation frequency of the control loop, a hysteresis element (for instance a comparator having a hysteresis-like performance) may be implemented. A hysteresis element may change its output levels not before the loop filter has accumulated a certain amount of difference in the feedback loop. Overall, the hysteresis may reduce or remove any time quantization error and may control the oscillation frequency, making the modulator stable.

The sampling subsequent to the asynchronous sigma-delta modulator may be performed as fast as possible for reducing or minimizing time errors.

A time stamp unit may be provided for detecting, defining, and/or outputting a desired sample time, thereby defining or influencing points of time at which the signal is sampled.

According to an exemplary embodiment, a D/A converter using an asynchronous sigma-delta modulator coded in a synchronously sampled bit streams is provided. Operation of such a DAC may be performed by synchronously sampling at a high bit rate. Alternatively, a noise shaped time quantization error may be taken into account. According to another exemplary embodiment, a D/A converter using a semi-asynchronous sigma-delta modulator may be provided coded in synchronously sampled bit streams.

Such DACs may be implemented in test devices, particularly in an arbitrary waveform generator in an automatic test equipment (ATE).

Particularly, a quantized kappa modulator may be used for a DAC. A kappa modulator may be particularly denoted as a loop filter connected in serial with a hysteresis comparator with a feedback loop connecting an output of the comparator with an input of the loop filter. Such a kappa modulator or asynchronous sigma-delta modulator may generate asynchronous transition times. A subsequent arrangement of a time stamp unit, a noise shaper unit and a pulse width unit may be used to quantize the transition times to a fast fix clock with noise shaping to move quantization areas out of a signal band. After having passed the pulse width unit, the signal may be supplied to a digital drive unit.

As compared to a conventional kappa modulator, such a configuration may have the advantage that it can be used for clocked digital bit streams. E.g., the sampled output bit stream of an asynchronous sigma-delta modulator can be stored in the pattern memory of an automated test equipment and later output at a constant synchronous clock rate, although the modulator was originally asynchronous.

As compared to a conventional sigma-delta modulator, such a configuration may have the advantage that a fine time solution of a fast clock without increasing transition density may be used, like for high OSR/oversampling ratio sigma-delta modulators. The oscillator frequency of the kappa modulator can stay low.

A further advantage with regard to conventional sigma-delta modulators is the quantization errors may be reduced by a factor which is the ratio between the fastest possible bit frequency and the modulator (oscillation) frequency of the kappa modulator. Therefore, less noise shaping is needed, the OSR may be reduced, and the jitter sensitivity may be reduced. Furthermore, a better signal-to-noise ratio may be obtained. Embodiments may be implemented particularly advantageously when the fastest possible bit frequency is larger than the modulator (oscillation) frequency.

According to an exemplary embodiment of the invention, a semi-synchronous sigma-delta modulator may be provided.

It is possible to keep the sample frequency moderate, for instance the 10-fold or the 20-fold of the modulation frequency. It is further possible to noise shape the remaining quantization error with the fastest possible bit frequency.

Next, further exemplary embodiments of the digital-to-analog converter will be explained. However, these embodiments also apply to the measurement device, to the method, to the program element and to the computer-readable medium.

The digital-to-analog converter may comprise a feedback loop which may be adapted for feeding back the signal processed by the comparator to the digital input signal, wherein the clock sample unit may be arranged outside of the feedback loop. In other words, only after having passed a bifurcation of the signal path at which the signal can be fed back to an input, the clock sample unit may be arranged which is thereby provided after or behind the asynchronous sigma-delta modulator unit. This may allow to decouple operation of the asynchronous sigma-delta modulator and operation of the clock sample unit.

Particularly, the clock sample unit may be arranged in a signal path following or "downstream" the feedback loop.

The digital-to-analog converter may comprise a combining unit adapted for combining the signal processed by the comparator (delivered via the feedback loop) with the digital input signal. Such a combining unit may add or subtract the input signal and the signal fed back from an output of the asynchronous sigma-delta modulator.

The comparator may be arranged in a signal path behind the low pass filter. Therefore, it may be possible that the signal to be processed is first supplied to the low pass or integrator unit, then passes the comparator, and after having passed the comparator, the signal may be fed back to an input of the loop filter and further may be supplied to an input of a subsequently arranged sample unit.

The comparator may comprise a hysteresis feature which may make the feedback loop stable without introducing time quantization noise.

The digital-to-analog converter may further comprise a driver unit coupled to an output of the clock sample unit. In other words, after being modified by the clock, the signal may be supplied to the driver for further processing.

The digital-to-analog converter may further comprise an analog filter coupled to an output of the driver unit. After having passed such an analog filter, the signal is properly converted in an outputable analog format.

Beyond this, the digital-to-analog converter may comprise a time stamp unit adapted for detecting points of time for sampling the signal processed by the comparator. Such a time stamp unit may therefore detect which times would be proper for changing the output level.

The digital-to-analog converter may further comprise a noise shaper unit adapted for processing, based on the clock signal of the clock sample unit, a signal output by the time stamp unit. Therefore, a noise shaper may be a building block for shifting noise from an "in band" range to an "out of band" range where it can be easily removed or does not disturb significantly.

In the following, an exemplary embodiment of the measurement apparatus will be explained. However, this embodiment also implies to the digital-to-analog converter, to the method, to the program element and to the computer-readable medium.

The measurement apparatus may comprise at least one of a sensor device, a test device for testing a device under test or a substance, a device for chemical, biological and/or pharmaceutical analysis, a fluid separation system adapted for separating components of a fluid, a capillary electrophoresis device, a liquid chromatography device, a gas chromatography device, an electronic measurement device, and a mass spectroscopy device. Particularly, the DAC according to exemplary embodiments of the invention may be implemented in an automatic test equipment in which devices like memories, chips for mobile phones, other electronic products are tested.

Therefore, according to an exemplary embodiment, an asynchronous sigma-delta DAC may be provided for performing D/A conversion for the generation of analog waveforms for a measurement. Exemplary embodiments may be implemented in an automatic test equipment configuration, that is to say for testing devices under test (DUT).

Such a digital-to-analog-converter may be integrated in a test device in which an arbitrary waveform generator generates analog waveform signals to be applied to a device under test (DUT, for instance the microphone input of a cellular phone chip). Such analog sine waveforms may then be applied to pins of a DUT as a stimulus signal, and a digital response signal of the DUTs may be evaluated by an analysis unit of the tester. The output of such a tester may be a result signal indicative of whether or not the device under test is acceptable or has failed the test. In such a scenario, it may be advantageous to integrate a signal processing device according to an embodiment of the invention in such a test device, particularly within a digital-to-analog converter (DAC) of such a test device.

BRIEF DESCRIPTION OF THE DRAWINGS

Other objects and many of the attendant advantages of embodiments of the present invention will be readily appreciated and become better understood by reference to the following more detailed description of embodiments in connection with the accompanied drawings. Features that are substantially or functionally equal or similar will be referred to by the same reference signs.

Embodiments of the present invention will be detailed subsequently referring to the appended drawings, in which.

DETAILED DESCRIPTION OF THE INVENTION

Figure 1:
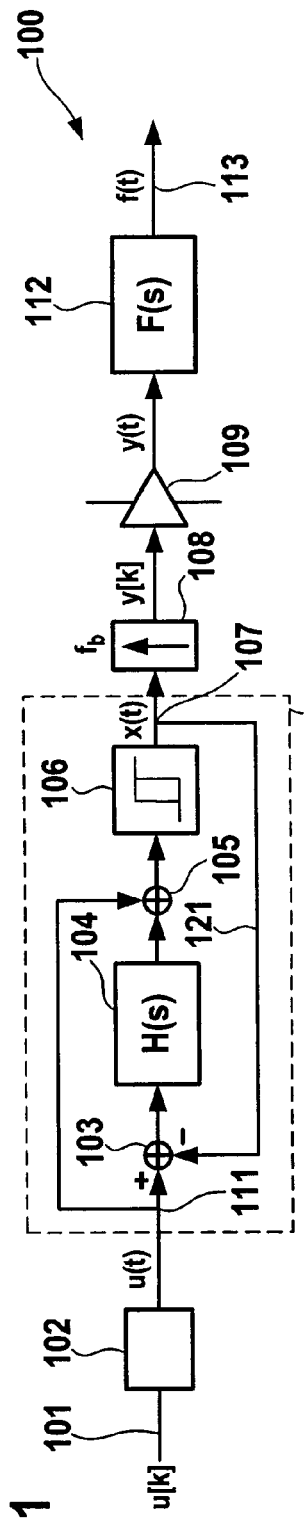
FIG. 1 to FIG. 3 show digital to analog converters according to exemplary embodiments of the invention.

The illustration in the drawing is schematically.

In the following, referring to FIG. 1, an asynchronous sigma-delta digital-to-analog converter 100 according to an exemplary embodiment of the invention will be explained.

Before describing the asynchronous sigma-delta digital-to-analog converter 100 in detail, the individual signals to be processed will be defined:

Following common notation, continuous time signal are denoted with time argument 't' in round brackets. e.g. x(t), whereas the samples of a discrete time signal are denoted with sample argument 'k' in square bracket, e.g. y[k]. Continuous time filters are denoted with the complex argument 's', e.g. F(s) or H(s).

The signal "u" denotes the digital input signal. The signal "f" denotes the filtered analog output signal. $f_b$ denotes the sample frequency. The signal "x" denotes the output of the continuous time comparator output. y denotes the output of the last sample stage, i.e. the input of the last analog filter.

A loop filter 104 may be labelled H(s), since it is a continuous time filter which receives a continuous time signal x(t) as an input. x(t) may be denoted as a continuous time input signal (or as input signal), and x[k] may be denoted as a discrete time input signal (or as input samples).

At an input 101 of the digital-to-analog converter 100, a signal u[k] is provided. The digital signal u[k] may be converted by an upsampler block or sample & hold block 102 into a signal u(t) in the time domain. The signals input to the digital-to-analog converter 100 may be digital time-discrete value-continuous signals.

The upsampling unit 102 therefore outputs the signal u(t) and supplies this signal to a subtractor unit 103. The subtractor unit 103 forms a difference signal between the signal u(t) and a signal fed back from an output of a comparator 106 via a feedback loop 121. Optionally, the signal u(t) is split at a bifurcation point 111 and is supplied to the subtractor unit 103 and to a summation unit 105.

At an output of the subtractor unit 103, a signal is provided which is supplied to a loop filter 104. After filtering the signal in the unit 104, the processed signal is supplied to the summation unit 105 forming a sum of the signal u(t) and the output signal of the loop filter 104. The loop filter 104 can be a low-pass filter, or an integrator, or a band-pass filter of arbitrary order and frequency response.

A signal output by the summation unit 105 is input to the comparator 106 having a hysteresis feature. At a bifurcation point 107 at an output of the comparator unit 106, the signal x(t) is fed back to the subtractor unit 103.

Furthermore, at said bifurcation point 107, the signal x(t) is input to a clock sampling unit 108 in which the continuous time signal x(t) is sampled to convert it into a sampled signal y[k]. The signal y[k] is supplied to a drive unit 109 to generate a continuous time signal y(t) therefrom. This signal y(t) may be supplied to an analog filter unit 112 for filtering the signal based on a filter function F(s). Therefore, at an output of the digital-to-analog converter 100, a filtered analog output signal f(t) 113 is generated.

FIG. 1 illustrates an asynchronous sigma-delta DAC 100 having an asynchronous sigma delta modulator 120. The asynchronous sigma-delta loop system 120, 121 may be implemented in software. The oscillation frequency $f_{osc}$ of the asynchronous sigma-delta loop system depends on the hysteresis slack. The synchronous sampling of the DAC 100 may be performed in software with a bit frequency $f_b$ which may be significantly larger than the oscillator frequency $f_{osc}$ ($f_b \gg f_{osc}$). The architecture of FIG. 1 may have the advantage that the time quantization error may be very small, because $f_b$ may be significantly larger than $f_{osc}$. Furthermore, the jitter sensitivity may be decoupled from $f_b$ (controlled by $f_{osc}$). The output may still be synchronous to $f_b$.

The loop operation may be easiest understood when the loop filter 104 is implemented as an integrator. In the comparator 106 having the hysteresis feature, the transition points of the comparator 106 indicate when the loop difference has accumulated to the hysteresis slack. The transition times of the comparator output carry therefore information about the input signal 'u'.

Therefore, FIG. 1 shows an asynchronous sigma-delta digital-to-analog converter 100 for converting the digital input signal 101 into the analog output signal 113. The digital-to-analog converter 100 comprises the asynchronous sigma-delta modulator 120 comprising the loop filter 104 and the comparator 106 and being supplied with the digital input signal 101.

Furthermore, the clock sample unit 108 may sample the signal processed by the comparator 106 based sample clock rate $f_b$, thereby generating, after further processing, the analog output signal f(t).

In the configuration of FIG. 1, the asynchronous sigma-delta modulator 120 operates in a clock-free manner, that is to say independently of $f_b$. The feedback loop 121 is adapted for feeding back the signal x(t) processed by the comparator 106 to the digital input signal u(t), wherein the clock sample unit 108 is arranged outside of the feedback loop 121.

More particularly, the clock sample unit 108 is arranged in a signal path behind the feedback loop 121. The combining unit 103 combines the signal x(t) processed by the comparator 106 with the digital input signal u(t). The comparator 106 is connected in a signal path behind the loop filter 104. The comparator 106 has a hysteresis feature.

The driver unit 109 is coupled to an output of the clock sample unit 108. The analog filter unit 112 is coupled to an output of the driver unit 109.

In the following, referring to FIG. 2, a digital-to-analog converter 200 according to another exemplary embodiment of the invention will be explained.

In an exemplary embodiment, the asynchronous sigma-delta modulator 120 and the sampling unit 108 may be implemented in software on a computer or DSP (digital signal processor). Although the asynchronous sigma-delta modulator 120 is a time continuous system it can be modeled on a computer using mixed-signal simulation algorithms, such as Runge-Kutta. The modulator output may be sampled in software and stored in a file for further download into the pattern memory of a digital ATE (automatic test equipment) channel, where it may be played back later with a synchronous fixed sample clock.

Figure 2:
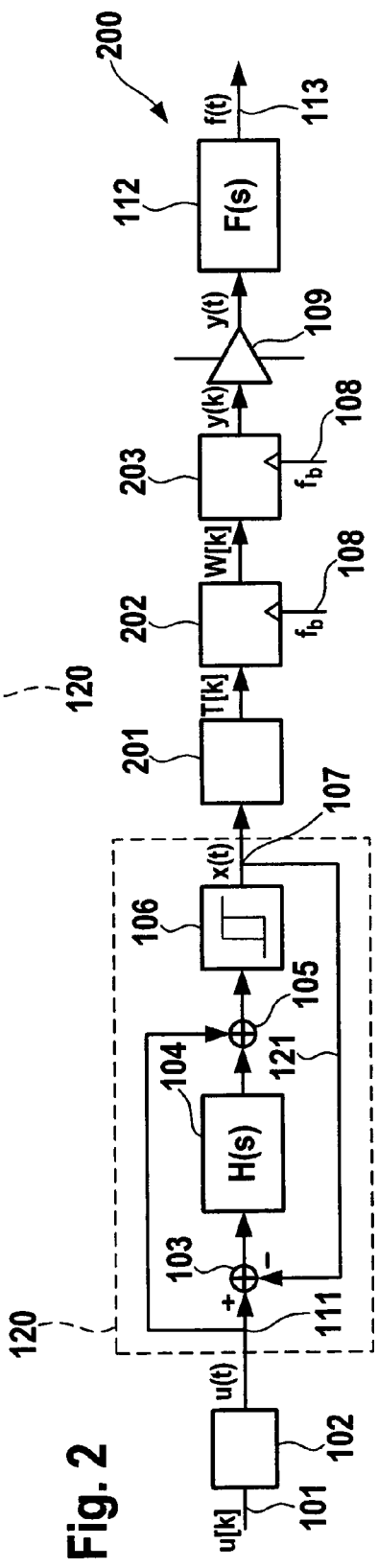

The embodiment of FIG. 2 shows a sampled asynchronous sigma-delta modulator with noise shaped time quantization error.

In this embodiment, a time stamp unit 201 is provided which is adapted for detecting points of time where the comparator output 106 transitions. Furthermore, a noise shaper unit 202 is provided which is adapted for processing a signal T[k] output by the time stamp unit 201 based on the clock signal $f_b$ of the clock sample unit 108. A pulse width modulator (PWM) unit 203 is adapted for processing a signal W[k] output by the noise shaper unit 202 based on the clock signal $f_b$ of the clock sample unit 108. The block comprising the components 201 to 203 is arranged between an output of the asynchronous sigma-delta modulator 120 and an input of the drive unit 109.

The term T[k] denotes time intervals between subsequent transitions of an asynchronous sigma-delta modulator output x(t). W[k] denotes a width quantized by $f_b$, as a result of noise shaped quantization. The pulse width modulator unit 203 expands the width W[k] to the bit stream y[k].

In an exemplary embodiment, all the blocks between u[k] and y[k] are implemented in software on the computer or on a DSP.

In the embodiment of FIG. 2, it is possible to detect quantization errors, to accumulate them and to consider these errors for future processing in order to increase accuracy. The pulse width modulator 203 may output a pulse width depending on whether an earlier sampling has been too early or too late. Therefore, a compensation may be achieved.

With the embodiment of FIG. 2, a remaining time quantization error may be reduced in a frequency band of interest (noise shaped).

In the following, referring to FIG. 3, a semi-asynchronous digital-to-analog converter 300 according to another exemplary embodiment of the invention will be explained.

Figure 3:
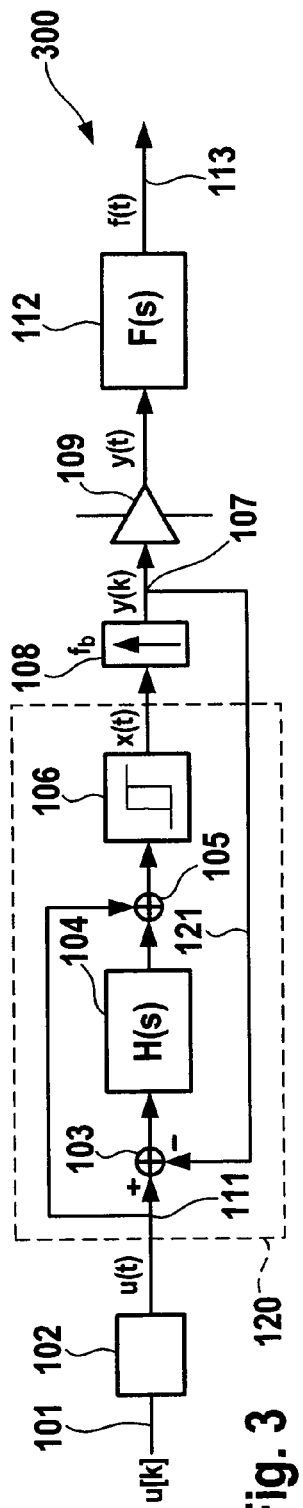

The embodiment of FIG. 3 is distinguished from the embodiment of FIG. 1 in that the bifurcation point 107 for feeding back the signal to the first subtractor unit 103 is located in the signal path behind the clock signal unit 108.

Such a semi-asynchronous configuration involves a sigma-delta loop 120, 121 with a hysteresis in synchronous software configuration. The time quantization error may be small because of the condition $f_b \gg f_{osc}$.

Furthermore, the remaining time quantization error may be reduced in the frequency band of interest (noise shape).

It should be noted that the term "comprising" does not exclude other elements or features and the "a" or "an" does not exclude a plurality. Also elements described in association with different embodiments may be combined. It should also be noted that reference signs in the claims shall not be construed as limiting the scope of the claims.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. An asynchronous sigma delta digital to analog converter for converting a digital input signal into an analog output signal, the digital to analog converter comprising:
an asynchronous sigma delta modulator comprising a loop filter and a comparator with a hysteresis function, the asynchronous sigma delta modulator being supplied with the digital input signal;

a clock sample unit adapted to sample, based on a clock signal, a signal output by the comparator, thereby generating the analog output signal;

wherein the asynchronous sigma delta modulator and clock sample unit are implemented by one of the group consisting of: electronic optimization circuits, a processor executing software stored on a non-transitory computer-readable medium, and a hybrid of electronic optimization circuits and a processor executing software stored on a non-transitory computer-readable medium.

2. The digital to analog converter of claim 1, wherein the asynchronous sigma delta modulator is operated in a clock-free manner.

3. The digital to analog converter of claim 1, comprising a feedback loop adapted for feeding back the signal processed by the comparator to the input signal, wherein the clock sample unit is arranged outside of the feedback loop.

4. The digital to analog converter of claim 3, wherein the clock sample unit is arranged in a signal path inside the feedback loop.

5. The digital to analog converter of claim 1, wherein the loop filter comprises at least one of the group consisting of a low-pass filter, an integrator, and a band-pass filter.

6. The digital to analog converter of claim 1, wherein at least one component of the group consisting of the asynchronous sigma delta modulator and the clock sample unit is implemented by a processor executing software stored on a non-transitory computer-readable medium.

7. The digital to analog converter of claim 1, wherein the asynchronous sigma delta modulator and the clock sample unit are implemented by a processor executing software stored on a non-transitory computer-readable medium.

8. The digital to analog converter of claim 1, comprising a driver unit coupled to an output of the clock sample unit.

9. The digital to analog converter of claim 8, wherein the driver unit is implemented in hardware.

10. The digital to analog converter of claim 8, comprising an analog filter coupled to an output of the driver unit.

11. The digital to analog converter of claim 1, wherein the clock sample unit comprises:

a time stamp unit adapted for defining points of time for sampling the signal output by the comparator;

a noise shaper unit adapted for processing a signal output by the time stamp unit based on a clock signal; and a pulse width modulator adapted for processing a signal output by the noise shaper unit based on the clock signal.

12. The digital to analog converter of claim 1, comprising a sample and hold unit adapted to pre-process an initial digital input signal to generate a pre-processed input signal to be supplied to the asynchronous sigma delta modulator.

13. The digital to analog converter of claim 12, wherein the sample and hold unit is implemented by a processor executing software stored on a non-transitory computer-readable medium.

14. A measurement apparatus comprising:

a data generation unit adapted to generate a digital input signal related to a measurement carried out by the measurement apparatus;

an asynchronous sigma delta digital to analog converter for converting the digital input signal into an analog output signal, the digital to analog converter comprising:

an asynchronous sigma delta modulator comprising a loop filter and a comparator with a hysteresis function, the asynchronous sigma delta modulator being supplied with the digital input signal; and a clock sample unit adapted to sample, based on a clock signal, a signal output by the comparator, thereby generating the analog output signal.

15. The measurement apparatus of claim 14, comprising at least one of a sensor device, a test device for testing a device under test or a substance, a device for chemical, biological and/or pharmaceutical analysis, a fluid separation system adapted for separating compounds of a fluid, a capillary electrophoresis device, a liquid chromatography device, a gas chromatography device, an electronic measurement device, and a mass spectroscopy device.

16. A method of converting a digital input signal into an analog output signal, the method comprising:

supplying the digital input signal to an asynchronous sigma delta modulator comprising a loop filter and a comparator with a hysteresis function;

sampling, based on a clock signal, a signal output by the comparator, thereby generating the analog output signal; and feeding back the signal output by the comparator to the digital input signal, thereby forming a feedback loop, the sampling of the signal output by the comparator occurring outside of the feedback loop.

17. A computer-readable medium, in which a computer program of converting a digital input signal into an analog output signal is stored, which computer program, when being executed by a processor, is adapted to control or carry out a method of converting a digital input signal into an analog output signal, the method comprising:

supplying the digital input signal to an asynchronous sigma delta modulator comprising a loop filter and a comparator with a hysteresis function;

sampling, based on a clock signal, a signal output by the comparator, thereby generating the analog output signal; and feeding back the signal output by the comparator to the digital input signal, thereby forming a feedback loop, the sampling of the signal output by the comparator occurring outside of the feedback loop.

* * * * *